US012183424B2

(12) United States Patent
Rawat et al.

(10) Patent No.: US 12,183,424 B2
(45) Date of Patent: Dec. 31, 2024

(54) BIT-CELL ARCHITECTURE BASED IN-MEMORY COMPUTE

(71) Applicant: STMicroelectronics International N.V., Geneva (CH)

(72) Inventors: Harsh Rawat, Faridabad (IN); Kedar Janardan Dhori, Ghaziabad (IN); Promod Kumar, Greater Noida (IN); Nitin Chawla, Noida (IN); Manuj Ayodhyawasi, Noida (IN)

(73) Assignee: STMicroelectronics International N.V., Geneva (CH)

( * ) Notice: Subject to any disclaimer, the term of this patent is extended or adjusted under 35 U.S.C. 154(b) by 75 days.

(21) Appl. No.: 17/954,060

(22) Filed: Sep. 27, 2022

(65) Prior Publication Data

US 2023/0102492 A1 Mar. 30, 2023

Related U.S. Application Data

(60) Provisional application No. 63/250,649, filed on Sep. 30, 2021.

(51) Int. Cl.
*G11C 7/10* (2006.01)
*G11C 7/12* (2006.01)

(52) U.S. Cl.
CPC .......... *G11C 7/1087* (2013.01); *G11C 7/1069* (2013.01); *G11C 7/12* (2013.01)

(58) Field of Classification Search
CPC ........ G11C 7/1087; G11C 7/1069; G11C 7/12
See application file for complete search history.

(56) References Cited

U.S. PATENT DOCUMENTS

| 5,530,824 | A | 6/1996 | Peng et al. |
| 6,816,408 | B2 | 11/2004 | Blodgett |
| 6,909,663 | B1* | 6/2005 | Vernenker ............... G11C 8/16 365/69 |
| 11,474,788 | B2 | 10/2022 | Chawla et al. |
| 11,853,594 | B2* | 12/2023 | Hua ...................... G06N 3/065 |
| 2005/0162959 | A1* | 7/2005 | Lee ..................... G11C 11/4094 365/222 |

(Continued)

OTHER PUBLICATIONS

Agrawal et al., "Xcel-RAM: Accelerating Binary Neural Networks in High-Throughput SRAM Compute Arrays," *IEEE Transactions on Circuits and Systems-I: Regular Papers* 66(8):3064-3076, Aug. 2019.

(Continued)

*Primary Examiner* — Min Huang
(74) *Attorney, Agent, or Firm* — Seed IP Law Group LLP

(57) ABSTRACT

A memory array includes a plurality of bit-cells arranged as a set of rows of bit-cells intersecting a plurality of columns. The memory array also includes a plurality of in-memory-compute (IMC) cells arranged as a set of rows of IMC cells intersecting the plurality of columns of the memory array. Each of the IMC cells of the memory array includes a first bit-cell having a latch, a write-bit line and a complementary write-bit line, and a second bit-cell having a latch, a write-bit line and a complementary write-bit line, wherein the write-bit line of the first bit-cell is coupled to the complementary write-bit line of the second bit-cell and the complementary write-bit line of the first bit-cell is coupled to the write-bit line of the second bit-cell.

33 Claims, 15 Drawing Sheets

(56) References Cited

U.S. PATENT DOCUMENTS

| | | |
|---|---|---|
| 2019/0205095 A1 | 7/2019 | Gupta et al. |
| 2020/0126178 A1 | 4/2020 | Munteanu et al. |
| 2020/0160157 A1 | 5/2020 | Kim et al. |
| 2022/0301605 A1* | 9/2022 | Mirhaj .................. G11C 11/418 |
| 2023/0059091 A1* | 2/2023 | Ezzadeen ............... H03K 3/037 |

OTHER PUBLICATIONS

Agrawal et al., "X-SRAM: Enabling In-Memory Boolean Computations in CMOS Static Random Access Memories," *IEEE Transactions on Circuits and Systems I: Regular Papers* 65(12):4219-4232, Dec. 2018.

Biswas et al., "CONV-SRAM: An Energy-Efficient SRAM With In-Memory Dot-Product Computation for Low-Power Convolutional Neural Networks," *IEEE Journal of Solid-State Circuits* 54(1):217-230, Jan. 2019.

Dong et al., "15.3 A 351TOPS/W and 372.4GOPS Compute-in-Memory SRAM Macro in 7nm FinFET CMOS for Machine-Learning Applications," *2020 IEEE International Solid-State Circuits Conference (ISSCC)*, pp. 242-244, Feb. 18, 2020.

Jia et al., "A Programmable Heterogeneous Microprocessor Based on Bit-Scalable In-Memory Computing," *IEEE Journal of Solid-State Circuits* 55(9):2609-2621, Sep. 2020.

Jiang et al., "C3SRAM: An In-Memory-Computing SRAM Macro Based on Robust Capacitive Coupling Computing Mechanism," *IEEE Journal of Solid-State Circuits* 55(7):1888-1897, Jul. 2020.

Kang et al., "A Multi-Functional In-Memory Inference Processor Using a Standard 6T SRAM Array," *IEEE Journal of Solid-State Circuits* 53(2):642-655, Feb. 2018.

Kim et al., "Area-Efficient and Variation-Tolerant In-Memory BNN Computing using 6T SRAM Array," *2019 Symposium on VLSI Circuits*, pp. C118-C119, 2019.

Si et al., "15.5 A 28nm 64Kb 6T SRAM Computing-in-Memory Macro with 8b MAC Operation for AI Edge Chips," *2020 IEEE International Solid-State Circuits Conference (ISSCC)*, pp. 246-248, Feb. 18, 2020.

Si et al., "24.5 A Twin-8T SRAM Computation-In-Memory Macro for Multiple-Bit CNN-Based Machine Learning," *2019 IEEE International Solid-State Circuits Conference (ISSCC)*, pp. 396-398, Feb. 20, 2019.

Su et al., "15.2 A 28nm 64Kb Inference-Training Two-Way Transpose Multibit 6T SRAM Compute-in-Memory Macro for AI Edge Chips," *2020 IEEE International Solid-State Circuits Conference (ISSCC)*, pp. 240-242, Feb. 18, 2020.

Valavi et al., "A 64-Tile 2.4-Mb In-Memory-Computing CNN Accelerator Employing Charge-Domain Compute," *IEEE Journal of Solid-State Circuits* 54(6):1789-1799, Jun. 2019.

Yin et al., "XNOR-SRAM: In-Memory Computing SRAM Macro for Binary/Ternary Deep Neural Networks," *IEEE Journal of Solid-State Circuits* 55(6):1733-1743, Jun. 2020.

Zhang et al., "In-Memory Computation of a Machine-Learning Classifier in a Standard 6T SRAM Array," *IEEE Journal of Solid-State Circuits* 52(4):915-924, Apr. 2017.

\* cited by examiner

BIT-CELL ARCHITECTURE BASED IN-MEMORY COMPUTE

BACKGROUND

Technical Field

The present disclosure generally relates to a memory array, such as a memory array used in a learning/inference machine (e.g., an artificial neural network (ANN)).

Description of the Related Art

Known computer vision, speech recognition, and signal processing applications benefit from the use of learning/inference machines, such as deep convolutional neural networks (DCNN). A DCNN is a computer-based tool that processes large quantities of data and adaptively "learns" by conflating proximally related features within the data, making broad predictions about the data, and refining the predictions based on reliable conclusions and new conflations. The DCNN is arranged in a plurality of "layers," and different types of predictions are made at each layer.

For example, if a plurality of two-dimensional pictures of faces is provided as input to a DCNN, the DCNN will learn a variety of characteristics of faces such as edges, curves, angles, dots, color contrasts, bright spots, dark spots, etc. These one or more features are learned at one or more first layers of the DCNN. Then, in one or more second layers, the DCNN will learn a variety of recognizable features of faces such as eyes, eyebrows, foreheads, hair, noses, mouths, cheeks, etc.; each of which is distinguishable from all of the other features. That is, the DCNN learns to recognize and distinguish an eye from an eyebrow or any other facial feature.

BRIEF SUMMARY

In an embodiment, an in-memory-compute memory cell comprises a first bit-cell having a latch, a write-bit line and a complementary write-bit line, and a second bit-cell having a latch, a write-bit line and a complementary write-bit line. The write-bit line of the first bit-cell is coupled to the complementary write-bit line of the second bit-cell and the complementary write-bit line of the first bit-cell is coupled to the write-bit line of the second bit-cell. In an embodiment, the first bit-cell and the second bit-cell are foundry bit-cells.

In an embodiment, a memory array comprises a plurality of bit-cells arranged as a set of rows of bit-cells intersecting a plurality of columns of the memory array. The memory array also has a plurality of in-memory-compute (IMC) cells arranged as a set of rows of IMC cells of the memory array intersecting the plurality of columns of the memory array. Each of the IMC cells of the memory array includes a first bit-cell having a latch, a write-bit line and a complementary write-bit line, and a second bit-cell having a latch, a write-bit line and a complementary write-bit line. In each IMC cell, the write-bit line of the first bit-cell is coupled to the complementary write-bit line of the second bit-cell and the complementary write-bit line of the first bit-cell is coupled to the write-bit line of the second bit-cell.

In an embodiment, a system comprises a plurality of in-memory-compute (IMC) memory arrays. Each of the IMC memory array includes a plurality of bit-cells arranged as a set of rows of bit-cells intersecting a plurality of columns of the IMC memory array and a plurality of in-memory-compute (IMC) cells of the IMC memory array arranged as a set of rows of IMC cells intersecting the plurality of columns of the IMC memory array. The IMC cells have a first bit-cell having a latch, a write-bit line and a complementary write-bit line, and a second bit-cell having a latch, a write-bit line and a complementary write-bit line. In an IMC cell, the write-bit line of the first bit-cell is coupled to the complementary write-bit line of the second bit-cell and the complementary write-bit line of the first bit-cell is coupled to the write-bit line of the second bit-cell. The system has accumulation circuitry coupled to the columns of the plurality of IMC memory arrays.

In an embodiment, a method comprises storing weight data in a plurality of rows of an in-memory-compute (IMC) memory array arranged as a plurality of rows of cells intersecting a plurality of columns of cells, the IMC memory array include a set of rows of bit-cells and a set of rows of IMC cells. Each of the IMC cells of the IMC memory array includes a first bit-cell having a latch, a write-bit line and a complementary write-bit line and a second bit-cell having a latch, a write-bit line and a complementary write-bit line, wherein the write-bit line of the first bit-cell is coupled to the complementary write-bit line of the second bit-cell and the complementary write-bit line of the first bit-cell is coupled to the write-bit line of the second bit-cell. Feature data is stored in one or more rows of the set of rows of IMC cells. An IMC cell of a column of the IMC memory array multiplies feature data stored in the IMC cell and weight data stored in the column of the IMC cell. In an embodiment, a non-transitory computer-readable medium has contents, which, in operation, configure a computing system to perform the method.

BRIEF DESCRIPTION OF THE SEVERAL VIEWS OF THE DRAWINGS

Non-limiting and non-exhaustive embodiments are described with reference to the following drawings, wherein like labels refer to like parts throughout the various views unless the context indicates otherwise. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings. Moreover, some elements known to those of skill in the art have not been illustrated in the drawings for ease of illustration. One or more embodiments are described hereinafter with reference to the accompanying drawings in which.

DETAILED DESCRIPTION

The following description, along with the accompanying drawings, sets forth certain specific details in order to provide a thorough understanding of various disclosed embodiments. However, one skilled in the relevant art will recognize that the disclosed embodiments may be practiced in various combinations, without one or more of these specific details, or with other methods, components, devices, materials, etc. In other instances, well-known structures or components that are associated with the environment of the present disclosure, including but not limited to interfaces, power supplies, physical component layout, etc. in an in-compute memory environment, have not been shown or described in order to avoid unnecessarily obscuring descriptions of the embodiments. Additionally, the various embodiments may be methods, systems, or devices.

Throughout the specification, claims, and drawings, the following terms take the meaning explicitly associated herein, unless the context clearly dictates otherwise. The term "herein" refers to the specification, claims, and drawings associated with the current application. The phrases "in one embodiment," "in another embodiment," "in various embodiments," "in some embodiments," "in other embodiments," and other variations thereof refer to one or more features, structures, functions, limitations, or characteristics of the present disclosure, and are not limited to the same or different embodiments unless the context clearly dictates otherwise. As used herein, the term "or" is an inclusive "or" operator, and is equivalent to the phrases "A or B, or both" or "A or B or C, or any combination thereof," and lists with additional elements are similarly treated. The term "based on" is not exclusive and allows for being based on additional features, functions, aspects, or limitations not described, unless the context clearly dictates otherwise. In addition, throughout the specification, the meaning of "a," "an," and "the" include singular and plural references.

The computations performed by a DCNN, or by other neural networks, often include repetitive computations over large amounts of data. For example, many learning/inference machines compare known information, or kernels, with unknown data, or feature vectors, such as comparing known pixel groupings with a portion of an image. One type of common comparisons are dot products between the kernels and the feature vectors. However, kernel size, feature size, and depth tend to vary across different layers of the neural network. In some instances, dedicated computation circuits may be used to enable these operations over varying data sets.

Figure 1:
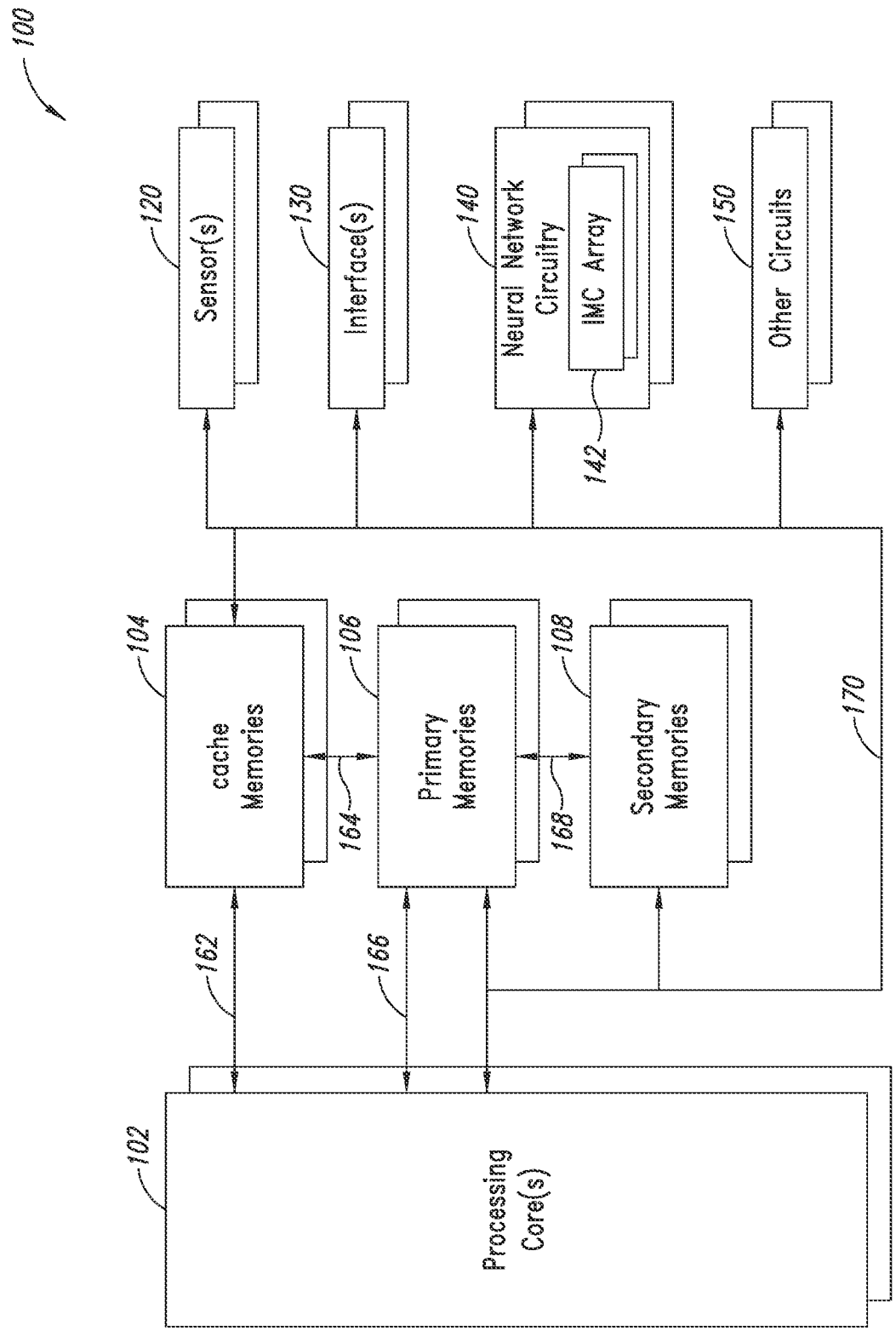
FIG. 1 is a functional block diagram of an embodiment of an electronic device or system having a processing core and a memory according to an embodiment.

FIG. 1 is a functional block diagram of an embodiment of an electronic device or system 100 of the type to which the embodiments, which will be described, may apply. The system 100 comprises one or more processing cores or circuits 102. The processing cores 102 may comprise, for example, one or more processors, a state machine, a microprocessor, a programmable logic circuit, discrete circuitry, logic gates, registers, etc., and various combinations thereof. The processing cores may control overall operation of the system 100, execution of application programs by the system 100, etc.

The system 100 includes one or more memories, such as one or more volatile and/or non-volatile memories which may store, for example, all or part of instructions and data related to control of the system 100, applications and operations performed by the system 100, etc. As illustrated, the system 100 includes one or more cache memories 104, one or more primary memories 106, and one or more secondary memories 108. One or more of the memories 104, 106, 108 may include a memory array, which, in operation, may be shared by one or more processes executed by the system 100.

The system 100 may include one or more sensors 120 (e.g., image sensors, audio sensors, accelerometers, pressure sensors, temperature sensors, etc.), one or more interfaces 130 (e.g., wireless communication interfaces, wired communication interfaces, etc.), and other circuits 150, which may include antennas, power supplies, etc., and a main bus system 170. The main bus system 170 may include one or more data, address, power and/or control buses coupled to the various components of the system 100. The system 100 also may include additional bus systems such as bus system 162, which communicatively couples the cache memory 104 and the processing core 102, bus system 164, which communicatively couples the cache memory 104 and the primary memory 106, bus system 166, which communicatively couples the primary memory 106 and the processing core 102, and bus system 168, which communicatively couples the primary memory 106 and the secondary memory 108.

The system 100 also includes neural network circuitry 140, which as illustrated includes one or more in-memory-compute (IMC) memory arrays 142, which, as discussed below with reference to FIGS. 4 to 14, comprise a plurality of IMC memory cells.

Figure 2:
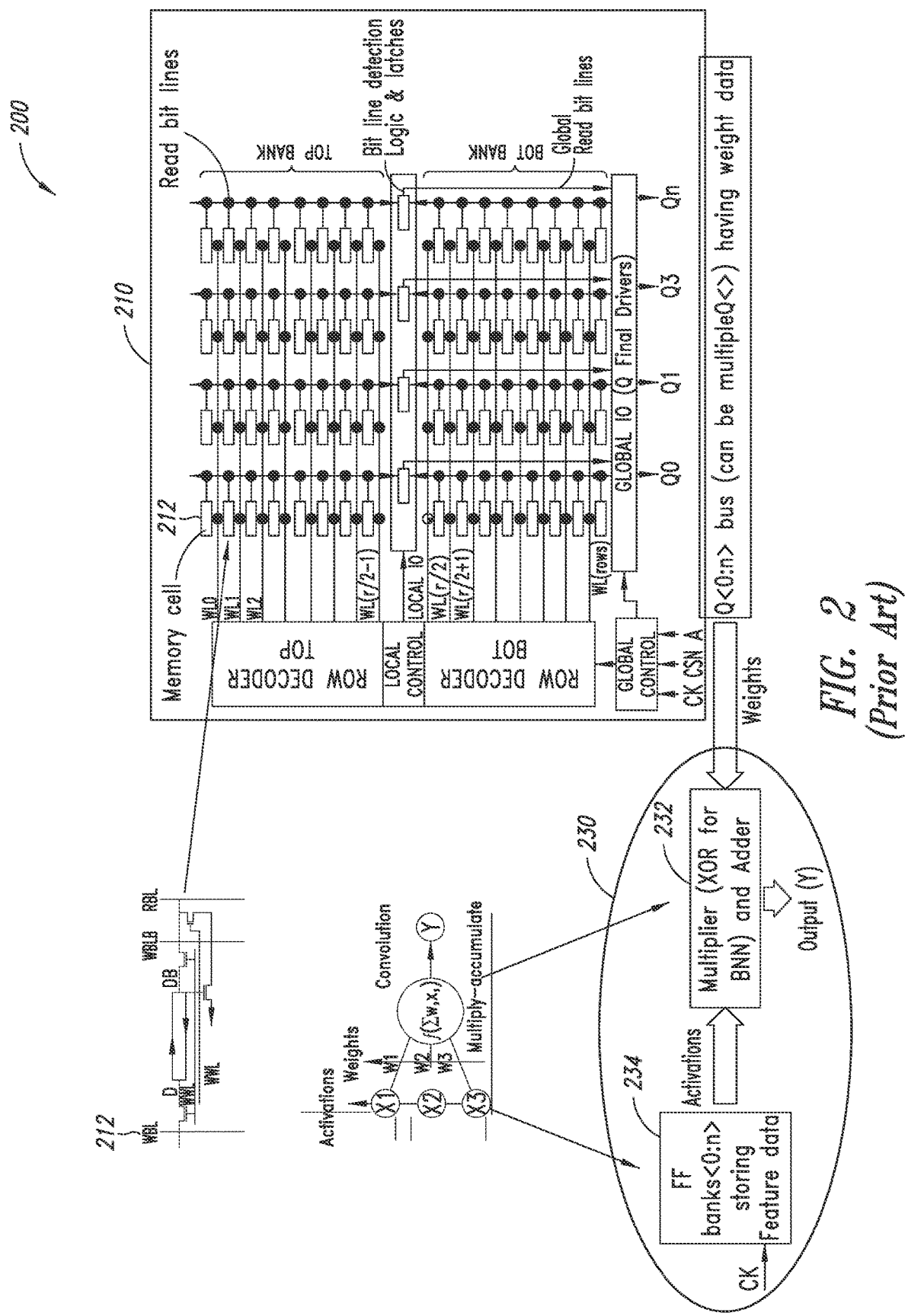
FIG. 2 illustrates a conventional system including a memory array and dedicated computational circuits, which may be used, for example, to perform calculations of a neural network.

FIG. 2 is a conception diagram illustrating a conventional system 200 including a memory array 210, and dedicated computational circuits 230, which may be used, for example, as a custom computing tile to perform calculations of a neural network. The memory array 210 includes a plurality of cells 212 configured in a column-row arrangement with a plurality of rows of cells intersecting a plurality of columns of cells. Each cell may be addressable via a particular column and a particular row (e.g., via read bit and word lines). Details of the functionality and components for accessing particular memory cells are known to those skilled in the art and not described herein for conciseness. The number of cells 212 illustrated in memory array 210 are for illustrative purposes only and systems employing embodiments described herein may include more or fewer cells in more or fewer columns and more or fewer rows. The cells 212 of the memory array 210 store a single bit of data.

As illustrated, outputs of the memory array 210 (e.g., weights for a convolutional operation as illustrated) are provided to the dedicated computational circuits 230. The dedicated computational circuits 230 as illustrated include a multiply and accumulate circuit 232 and banks of flip-flops 234, for example, to store feature data to provide activations for the computations. Such dedicated computational circuits 230 are bulky, thus requiring a lot of chip area, and may consume significant amounts of power, in addition to raising memory utilization issues.

Figure 3:
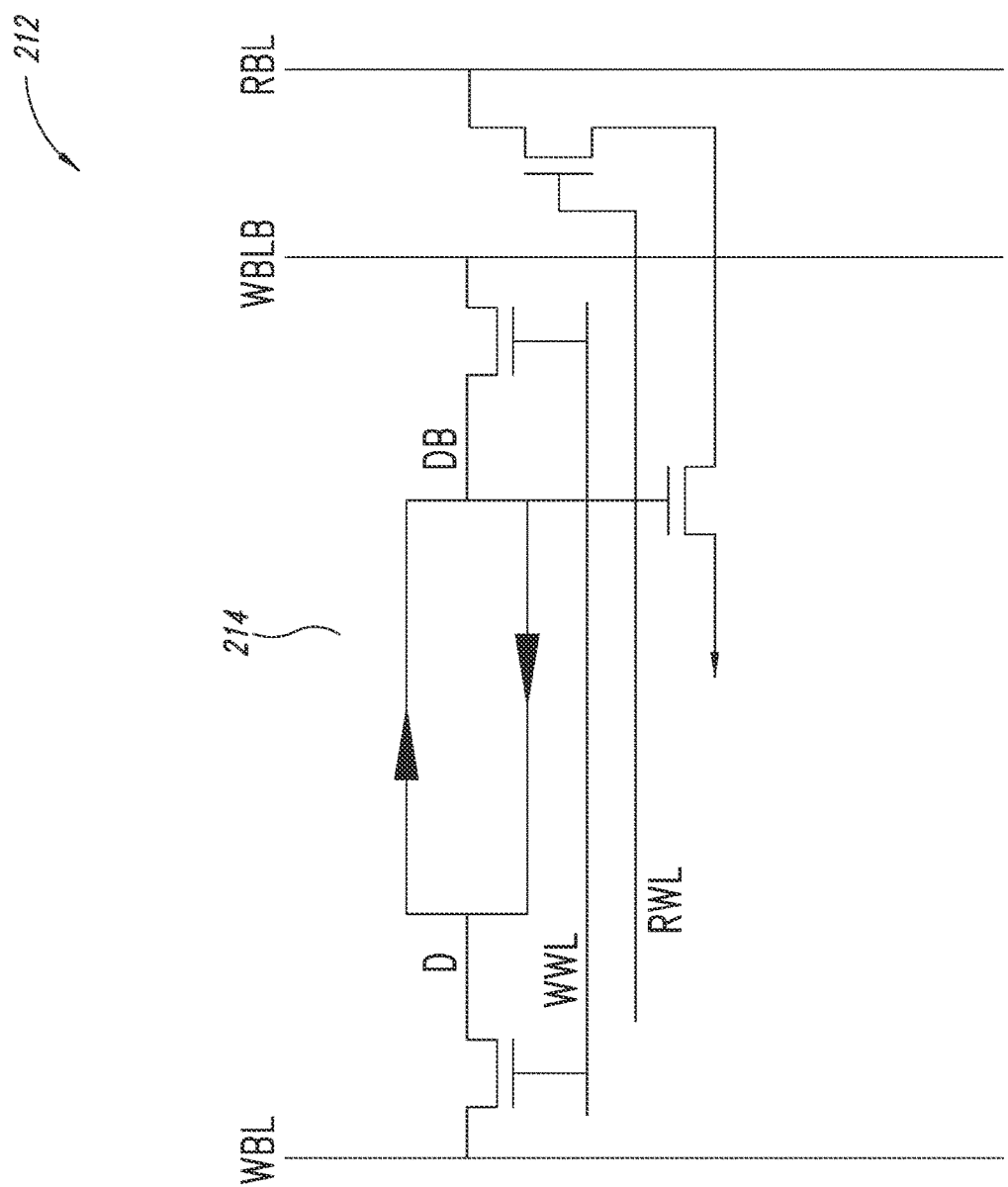
FIG. 3 illustrates an example of a conventional eight transistor bit cell in more detail.

FIG. 3 illustrates an example bit cell 212 of the memory array 210 of FIG. 2 in more detail. The bit cell 212 as illustrated comprises a first write bit line WBL and a second write bit line WBLB, a write word line WWL, a read word line RWL, and a latch 214.

Low-cost ANN devices and the introduction of in-memory-computing (IMC) in non-Von Neumann architectures may be facilitated by utilizing specialized memory structures for improving the energy efficiency and the compute density of such fabrics, for example, when applied to matrix vector multiplication operations such as those employed in modern deep neural network (DNN) architectures. Neural network operations may require extreme levels of parallel access, and may need to access multiple rows inside a same memory instance, which can present significant challenges with respect to the reliability of the bit cell content. These reliability issues may lead to information loss and reduced accuracy, which may have a significant impact on the statistical accuracy of neural network inference tasks when high levels of parallelism are employed.

The inventors have developed a novel IMC cell architecture which can be used in a memory array instead of a conventional bit cell to facilitate in-memory computing. A memory array utilizing such a IMC memory cell architecture facilitates IMC, for example, by facilitating high levels of access, such as access to multiple columns in a memory instance, while maintaining a high level of reliability and increasing computing density. Such a memory array may be employed as an IMC tile for neural network computations, providing both storage and multiplier logic, and as general purpose memory in other operational modes. The novel IMC cell may be based on a foundry bit cells (such as 6, 8, 10 or 12 transistor foundry bit cells, etc.) in specific configurations which may provide significant gains in density.

Figure 4:
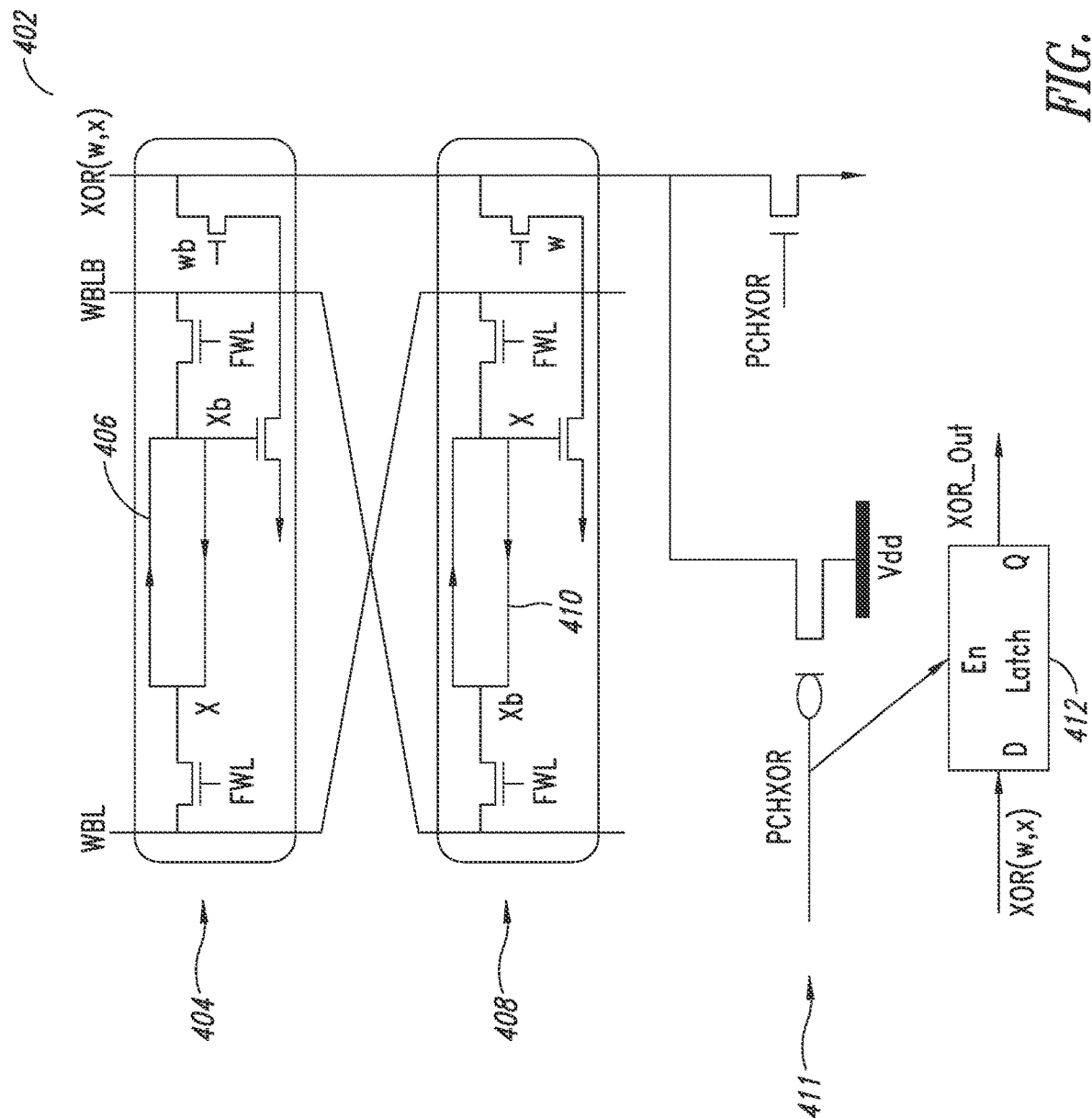
FIG. 4 illustrates an example embodiment of an in-memory-compute (IMC) cell.
Figure 5:
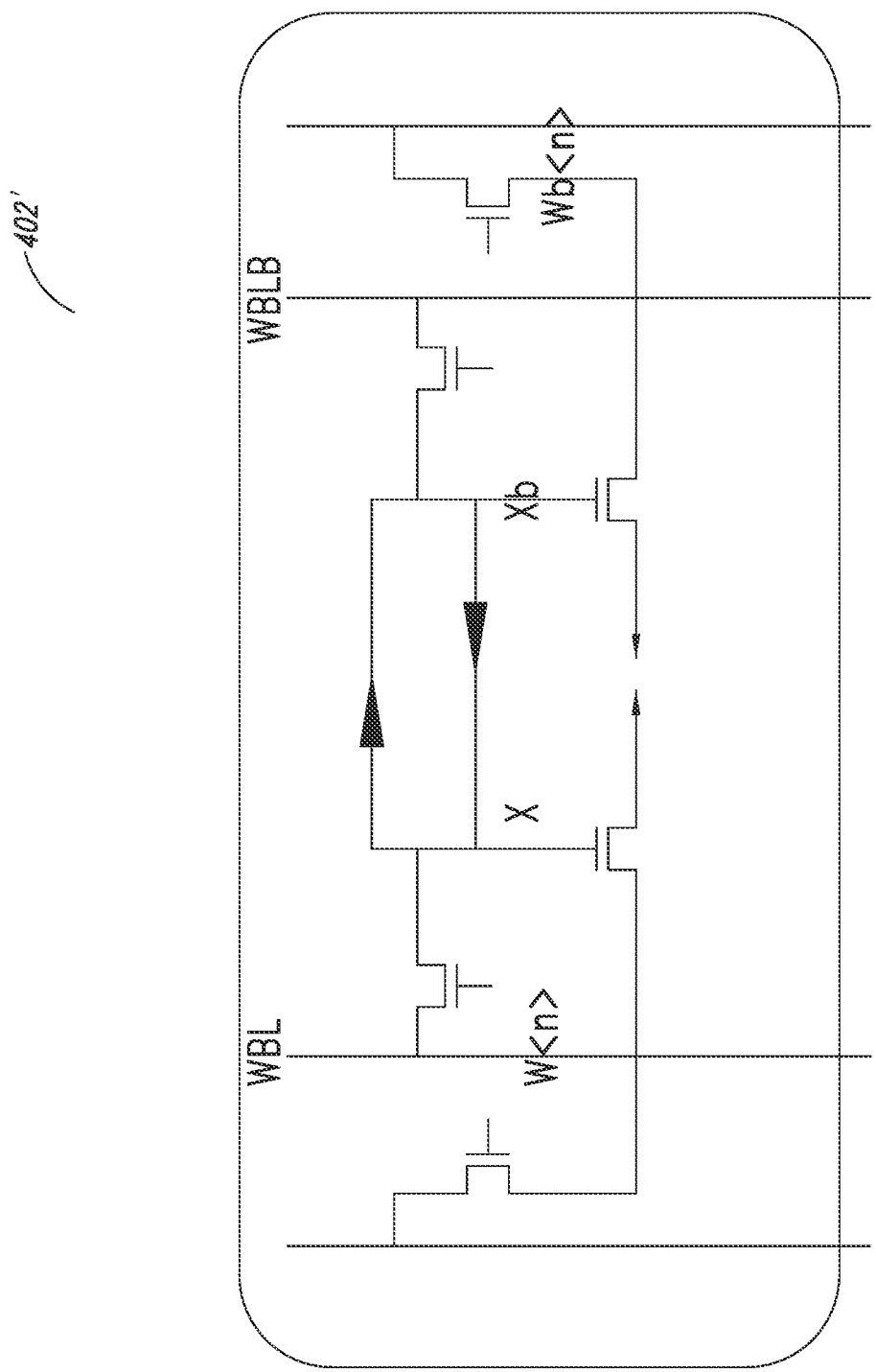
FIG. 5 illustrates a logical equivalent of the IMC cell of FIG. 4.

FIG. 4 illustrates an example architecture of an embodiment of an IMC cell 402, and FIG. 5 illustrates a logical equivalent 402' of the IMC cell 402 of FIG. 4. The IMC cell 402 comprises a first bit cell 404 having a first bit-cell latch 406, and a second bit cell 408 having a second bit-cell latch 410. The first bit cell 404 and the second bit cell 408 are coupled together with the first and second write bit lines of the bit cells crossed, the second write bit line of a bit cell being a complement of the first write-bit line of the bit cell. The first bit cell 404 and the second bit cell 408 may be foundry bit cells, such as 6, 8, 10, or 12 transistor foundry bit cells. As illustrated, the first write bit line WBL of the first bit cell 404 is coupled to the second write bit line WBLB of second bit cell 408, and the second write bit line WBLB of first bit cell 404 is coupled to the first write bit line WBL of second bit cell 408. A feature word line FWL functions as a feature write line when the IMC cell is operated in an IMC mode (e.g., as providing XOR multiplication functionality for a binary neural network), and as a word write line when the IMC cell is operated as a standard SRAM cell. An XOR enable line enables operation of the IMC cell in XOR mode. The latches 406, 410 store the feature data and the complement of the feature data (X, Xb), eliminating the need for the flop-flop bank 234 of FIG. 2. Weight data and the complement of the weight data (w, wb) are provided on the read word lines, which function as read bit lines of a weight array in an IMC mode. The IMC cell provides an XOR of the feature data and the weight data on line XOR(W,X), eliminating the need for a separate XOR multiplier.

As illustrated in FIG. 4, precharge circuitry 411 receives a precharge signal PCHXOR to precharge the XOR(W,X) line and enables a latch 412 to store the result of the XOR operation, which may be provided to an adder to complete a multiply-accumulate operation. Alternatively, the output of the XOR(W,X) line may be provided directly, for example, to an adder. The precharge signal PCHXOR may be generated by memory array management circuitry, such as the memory array management circuitry 160 of FIG. 1.

Some embodiments of an IMC cell may be customized. For example, an embodiment of an IMC cell may employ two 12 transistor bit cells, in order to generate a match signal (XOR) or a no match signal (XNOR).

Figure 6:
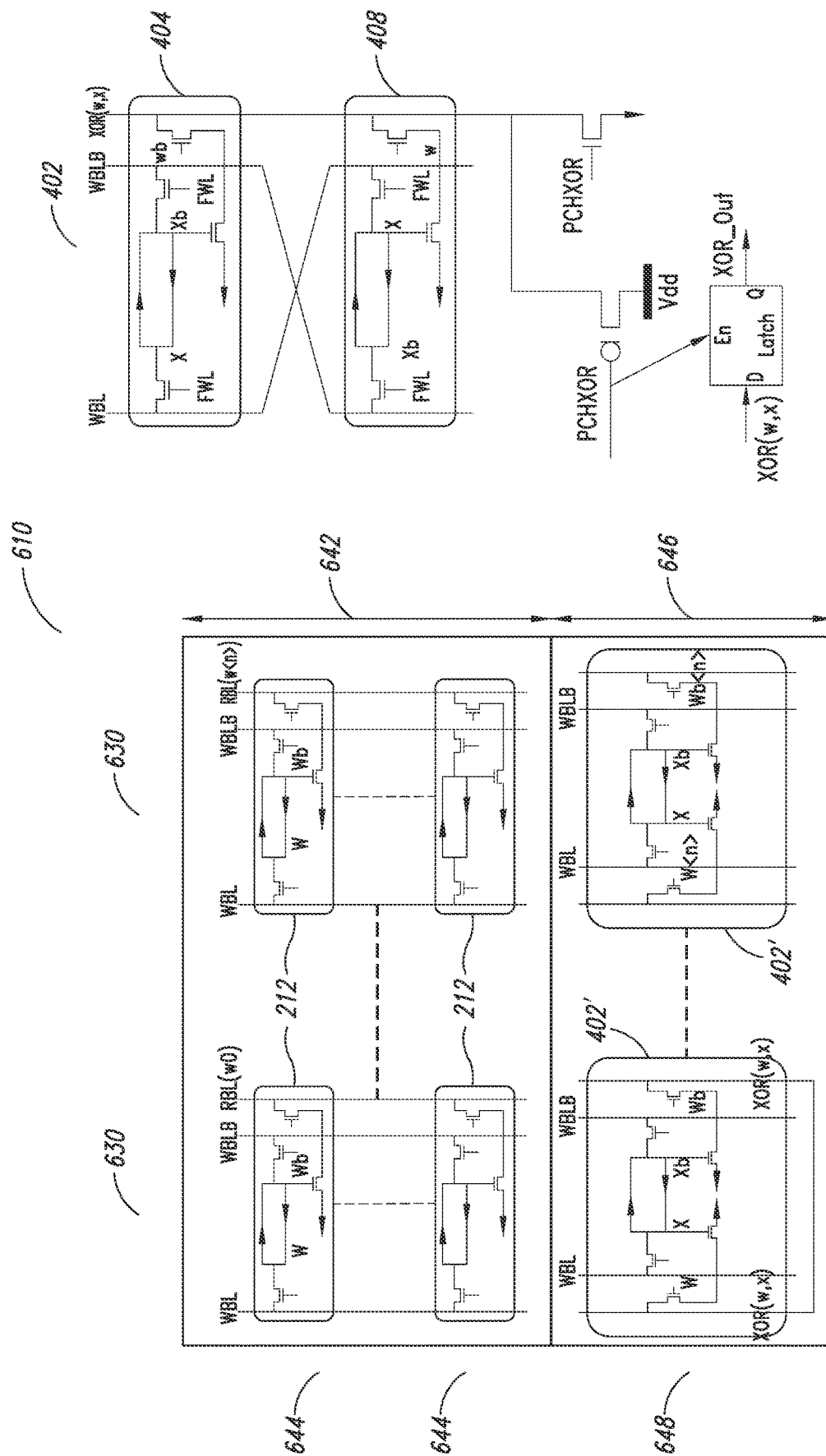
FIG. 6 illustrates an embodiment of a memory array that may be employed to in a neural network to provide an IMC tile to provide kernel storage and a feature buffer, and to perform multiplications, for a neural network in an IMC mode.

FIG. 6 illustrates an example embodiment of a memory array 610, that may be employed to provide kernel storage and a feature buffer for a neural network. For example, the memory array 610 may be employed as an in-memory-computing tile to perform calculations of a neural network, such as 1-bit binary neural network XOR implementation. The memory array 610 includes a plurality of cells configured in a column-row arrangement with a plurality of rows of cells intersecting a plurality of columns 630 of cells. Different from the embodiment of a memory array 210 of FIG. 2, the memory array 610 comprises a first set 642 of one or more rows 644 of bit cells 212, and a second set 646 of one or more rows 648 of IMC cells 402. As illustrated in FIG. 6, the logical equivalent IMC cell 402' is shown on the left, with an embodiment of an implementation IMC cell 402 shown in more detail on the right. The arrangement illustrated in FIG. 6 facilitates IMC XOR operations using foundry 8T bitcells based on push rules, which may provide a highly dense IMC memory cells which may be easily integrated into a conventional array of SRAMS.

In an IMC mode of operation, bit cells 212 of the first set 642 of one or more rows 644 of bit cells 212 may be configured to store kernel data (e.g., weights), and the second set 646 of one or more rows 648 of IMC cells 402 may be configured as a feature buffer, with each IMC cell 402 configurable as a flip-flop to store feature data and as a one bit binary neural network XOR multiplier, to XOR the stored feature data with a weight stored in another row of the IMC cell, and made available on a read bitline to provide the other XOR input.

In an SRAM mode of operation, each cell 212, 402 may be addressable via a particular column and a particular row (e.g., via read bit and word lines). Details of the functionality and components for accessing particular memory cells (e.g., address decoders) are known to those skilled in the art and not described herein for conciseness. The number of rows 644 of bit cells 212 and the number of rows 648 of IMC cells 402 illustrated in memory array 610 are for illustrative purposes only and systems employing embodiments described herein may include more or fewer cells in more or fewer columns and more or fewer rows. For example, an embodiment may have two or more rows 648 of IMC cells in the array 610 (e.g., two rows of IMC cells (see FIG. 11); four rows of IMC cells; etc.). The bit cells 212 of the one or more rows 644 of bit cells may, for example, be 6, 8, 10 or 12 transistor bit cells; the one or more rows 644 may implemented, for example, using a conventional SRAM array. The first and second bit cells 404, 408 of the IMC cells 402 may, for example, be 6, 8, 10 or 12 transistor bit cells. The bit cells 212 and the bit cells 404, 408, may employ different bit cell implementations (e.g., the bit cells 212 may be 6 transistor bit cells, while the bit cells 404, 408 may be 8 transistor bit cells; etc.).

As mentioned above, the embodiment of FIG. 6 facilitates employing a push-rule based IMC cell arrangement to enable feature data storage and parallel computation. This facilitates a clean integration of the IMC cells 402 into a memory array 610 to provide an IMC tile having high cell density. The memory array 610 may be accessed in a first-in-first-out (FIFO) manner using a streaming interface, instead of using memory map addressing typically employed in SRAM. Streaming dataflow interfaces to the IMC tile can further simplify integration of multiple tiles and allow efficient data re-layout and data mover engines to be added before or after the IMC tiles.

Figure 7:
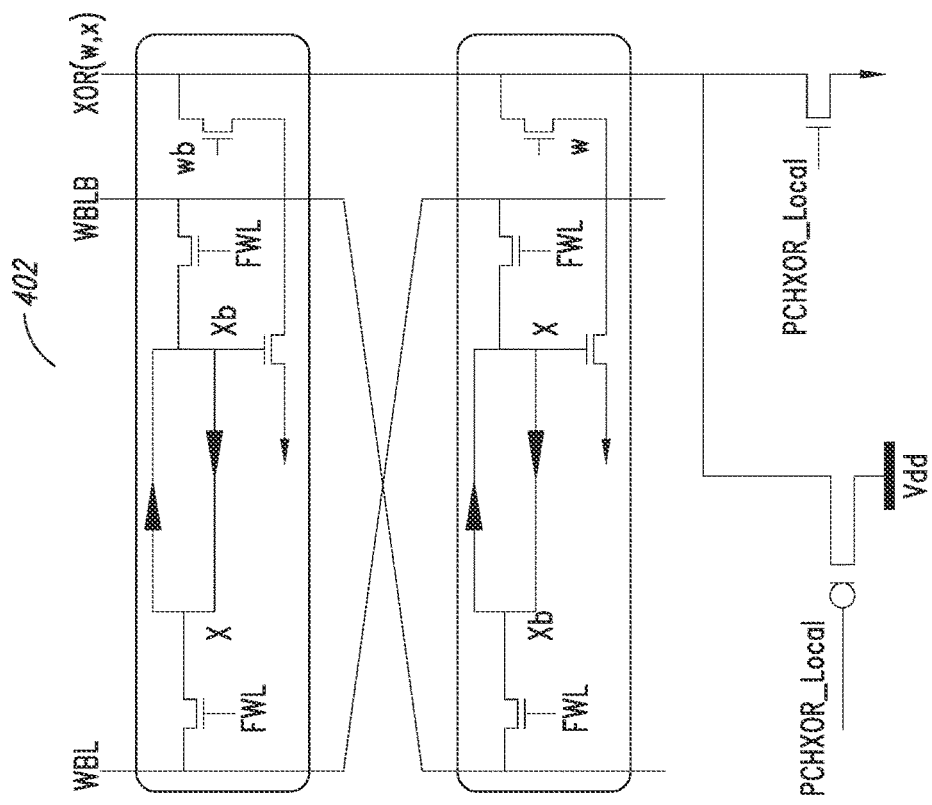
FIG. 7 illustrates an embodiment of masking circuitry that may be employed, for example, in the embodiment of a memory array of FIG. 6.
Figure 7:
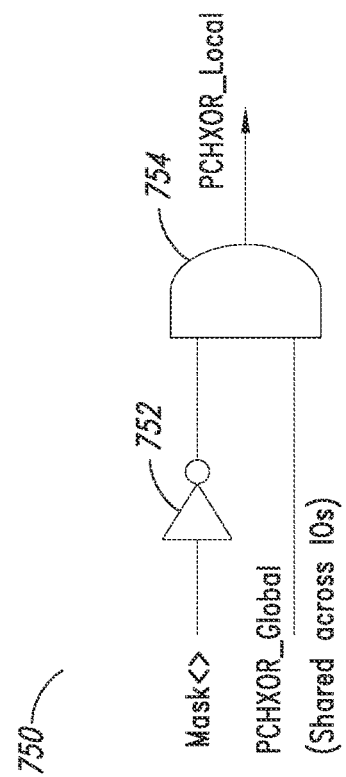

FIG. 7 illustrates an embodiment of masking circuitry 750 that may be employed, for example, in the embodiment of a memory array 610 of FIG. 6. For convenience, FIG. 7 is described with reference to FIG. 6. Each IMC cell 402 of a row 648 may have corresponding local mask control circuitry 750. As illustrated, the local mask control circuitry 750 has an inverter 752 to receive a local mask control signal Mask and an AND gate 754 to receive a global PCHXOR signal. The AND gate 754 provides a local PCHXOR signal as an output, which is used to precharge the IMC cell 402 into IMC mode. The local mask control circuitry 750 facilitates masking of particular columns of a memory array, such as masking of one or more columns 630 of memory array 610 of FIG. 6, by disabling XOR operation for an IMC cell 402 of selected columns. Masking of particular computations may be employed frequently in neural network processing, for example, to provide increased resolution. The local mask control signal Mask may be controlled by a system for a particular application. The local mask control signal may be kernel specific. In an embodiment, mask control signals used to mask inputs to the memory may be reused to mask columns of the memory array at output.

Figure 8:
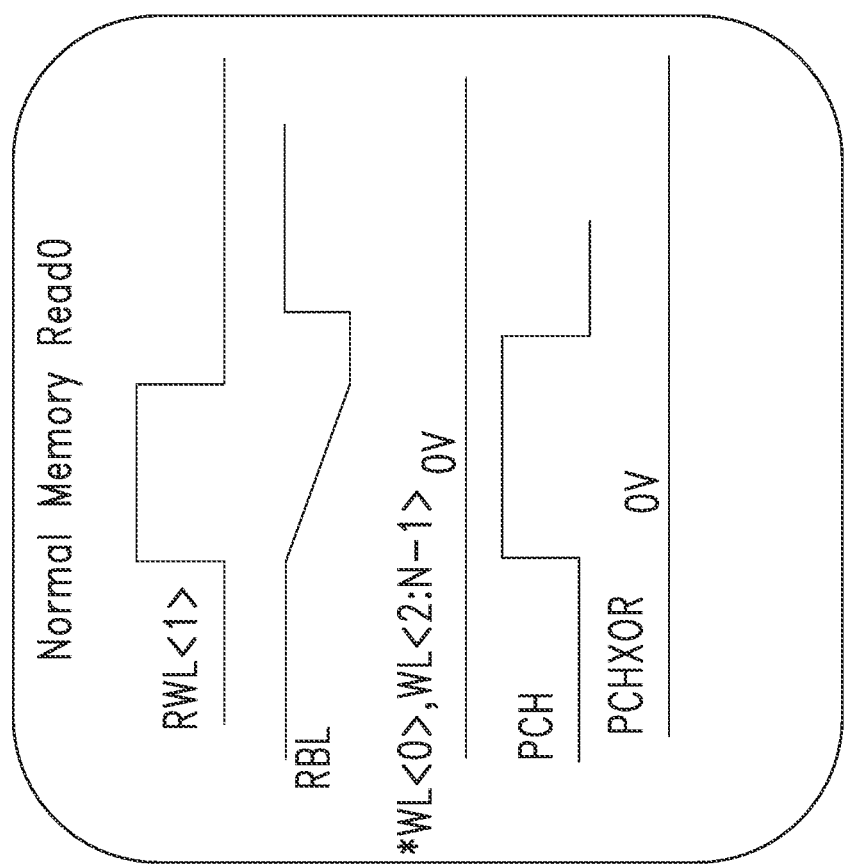
FIGS. 8, 9 and 10 illustrate example signals used to control the operation of an IMC memory array in various operational modes.
Figure 9:
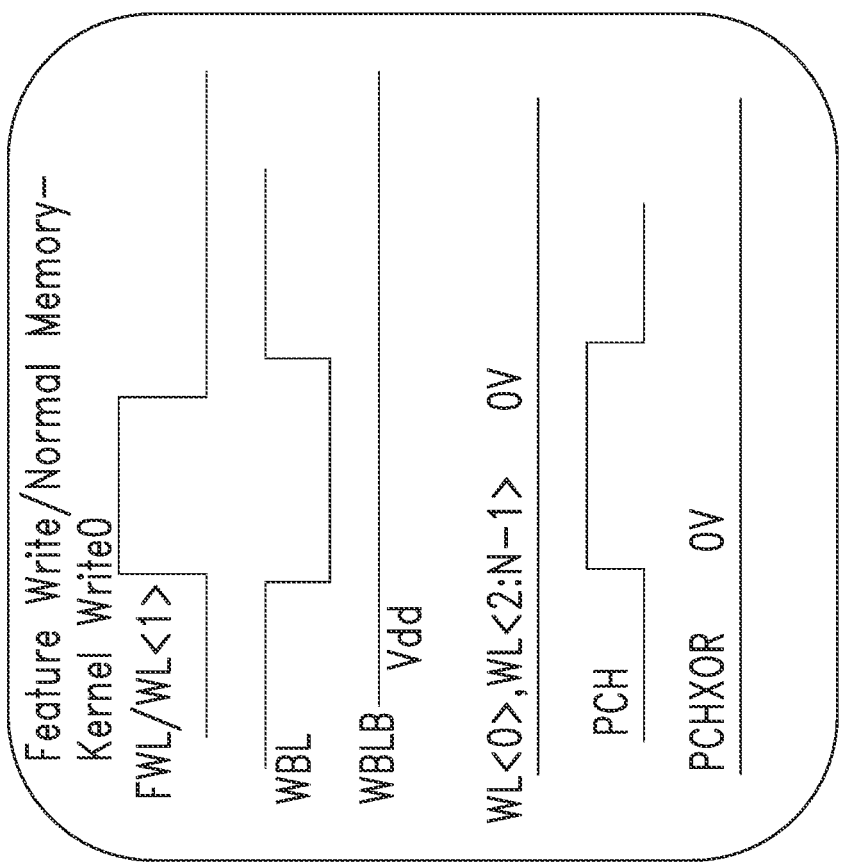
Figure 10:
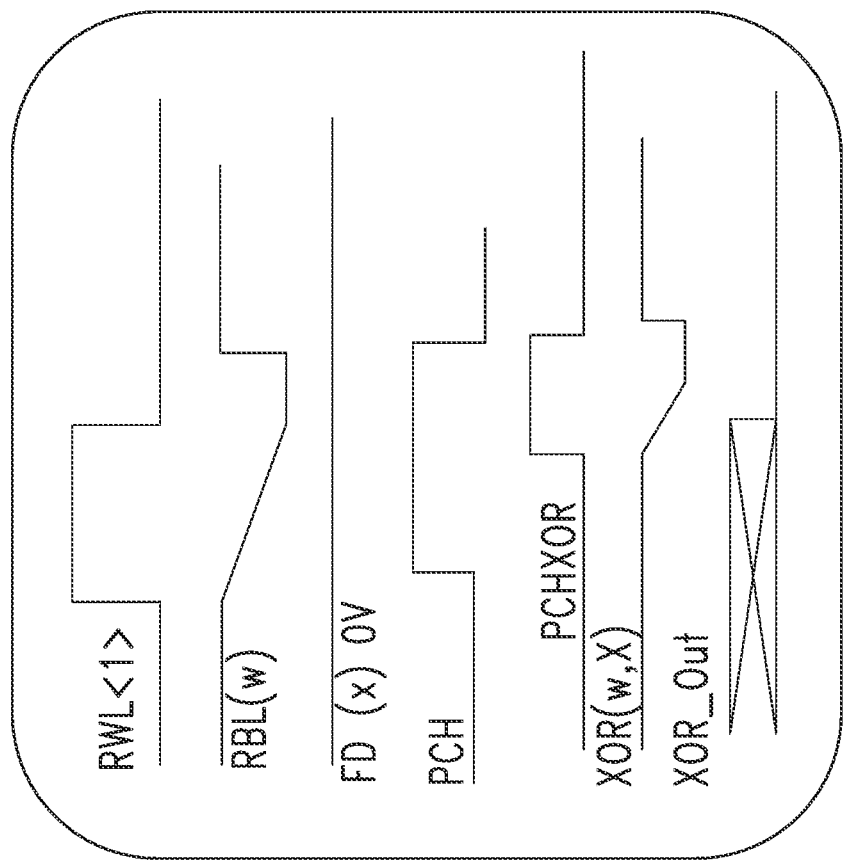

FIGS. 8, 9 and 10 illustrate example control signals used to control the operation of an IMC memory array in various operational modes, and will be described for convenience with reference to the memory array 610 of FIG. 6. PCH is a conventional precharge signal used in SRAMS. The PCH signal may be employed to control operation of the memory array 610 in a conventional or in an IMC mode of operation. FIG. 8 illustrates example control signals applied to an IMC memory array, such as the memory array 610 of FIG. 6, during a normal memory read of an IMC cell 402 (e.g., when the array is not being operated in an IMC mode). FIG. 9 illustrates example control signals applied to an IMC memory array during writing of feature data to an IMC cell 402 or kernel data to a bit cell 212 of the array. FIG. 10 illustrates example control signals applied to an IMC memory array during reading of an XOR result of an IMC cell 402. In computational mode, a PCHOFF pulse may be used to capture or latch the XOR result based on an XOR evaluation delay.

Figure 11:
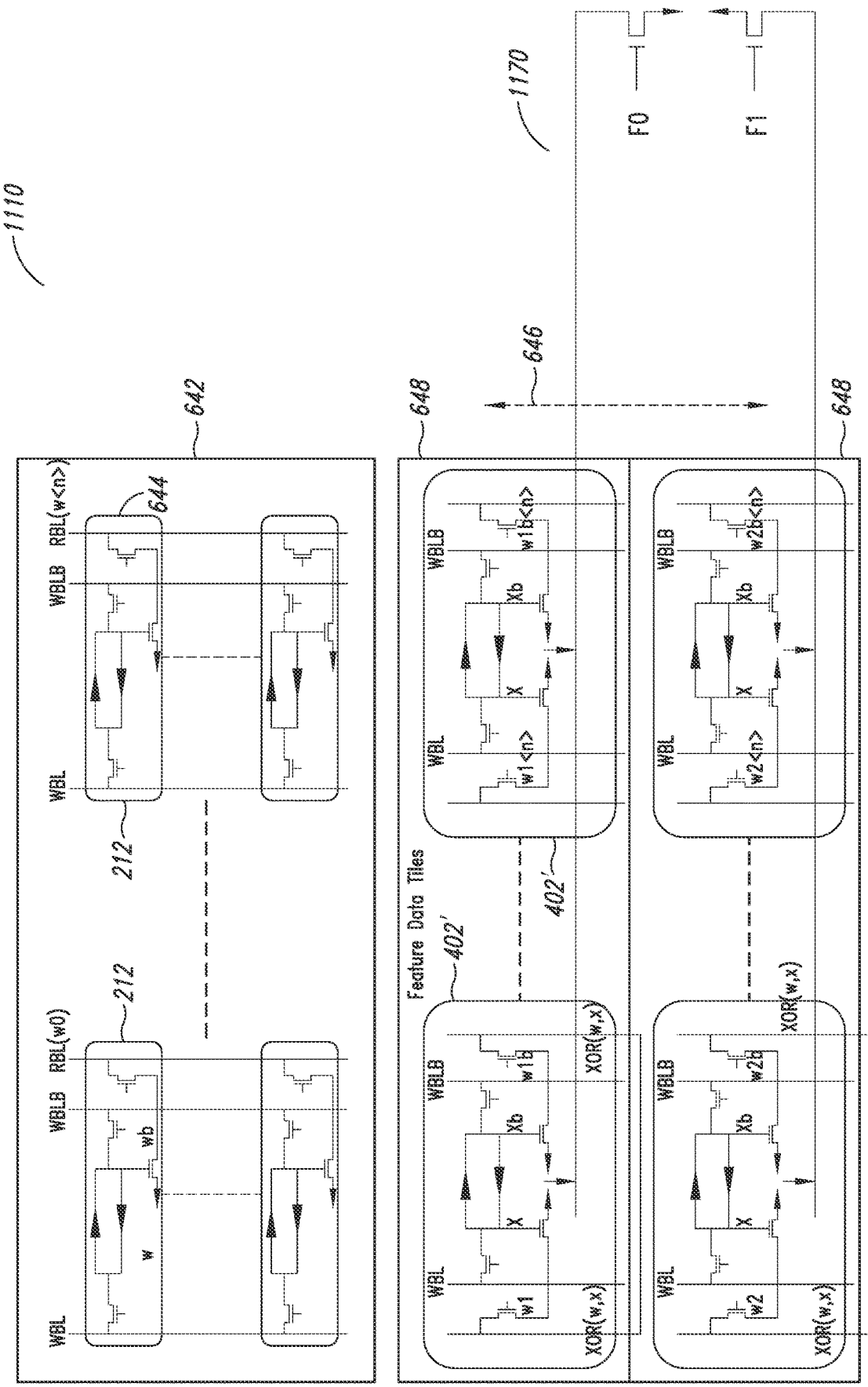
FIG. 11 illustrates an embodiment of a memory array implementing an IMC tile having a plurality of feature tiles.

FIG. 11 illustrates a memory array 1110 implementing an IMC tile having a plurality of feature tiles implemented using a plurality of rows of IMC cells. For convenience, the memory array 1110 of FIG. 11 will be described with reference to the memory array 610 of FIG. 6. The memory array 1110 includes a set 642 of one or more rows 644 of bit cells 212, and, as illustrated, a set 646 of two rows 644 of IMC cells 402 (for ease of illustration, the logical equivalent 402' is shown in FIG. 11). The rows 648 of IMC cells may be employed as feature tiles, with selection circuitry or a feature data selection bus 1170 used to select one of the feature tiles to be used in a particular IMC calculation. This facilitates reuse of kernel data (weights) with different feature data. The feature data is provided in a streaming manner to maximize the feature reuse in case of convolutional layer operations. The support of striding with the streaming feature data can further improve the reuse of feature data in convolutional layers. The additional rows 644 of IMC cells may be used for kernel storage in other IMC and SRAM operational modes (e.g., 4 rows 644 of IMC cells may be configured to provide 0-4 feature tiles, with the rows 644 not used as feature tiles being available for use as kernel storage rows). This provides a flexible geometry with extra available outputs. In some operational configurations, adder based accumulation may be employed, while in others, passive element based accumulation may be employed (e.g., capacitive accumulation), as well as various combinations thereof.

Figure 12:
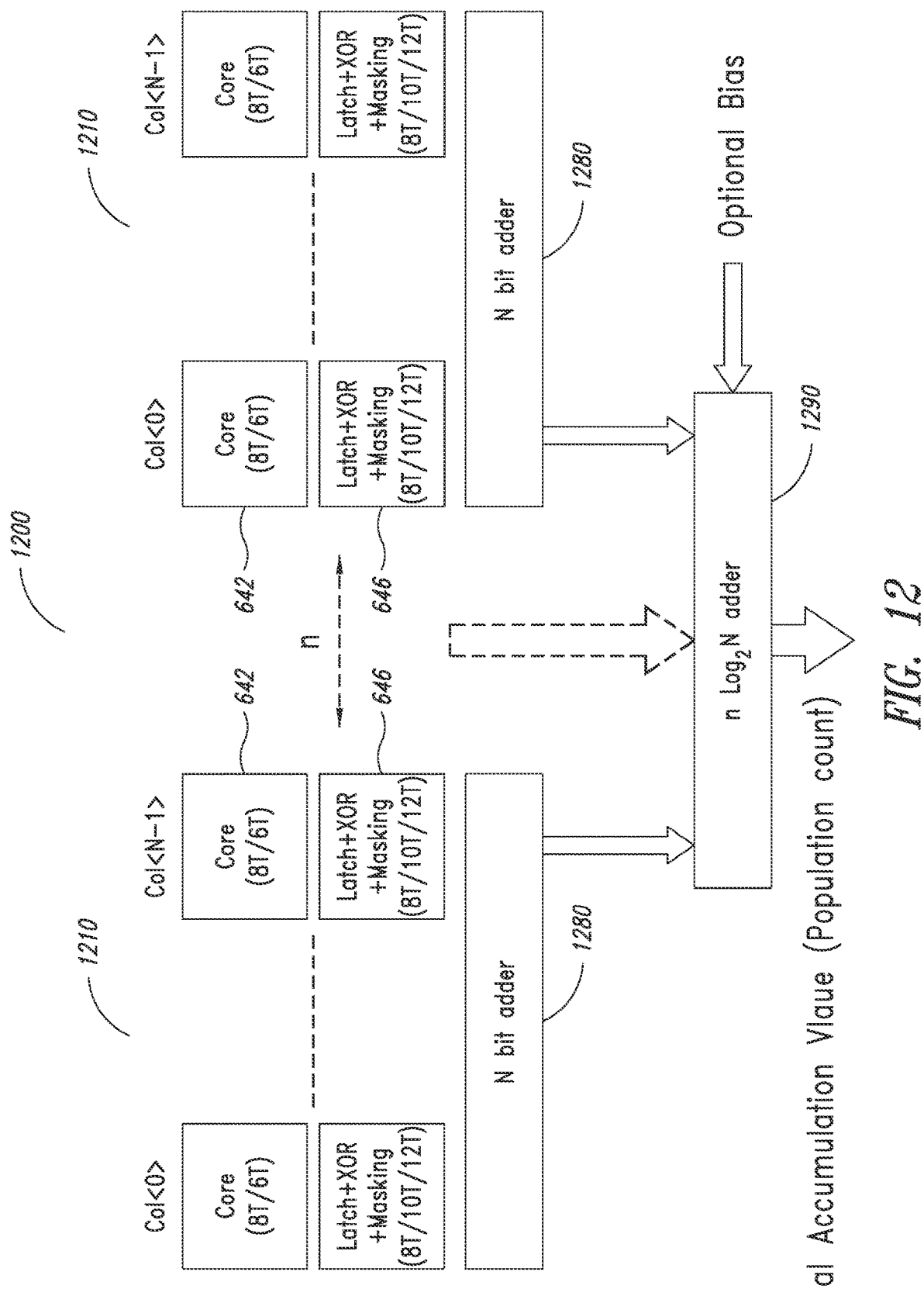
FIG. 12 illustrates an embodiment of system employing a plurality of IMC tiles to implement multiply-accumulate operations.

FIG. 12 illustrates an embodiment of system 1200 employing a plurality of n memory arrays configured as IMC tiles to implement multiply-accumulate operations in an adder-based accumulation. For convenience, FIG. 12 will be described with reference to FIG. 6. The system 1200 comprises a plurality of memory arrays 1210 having N columns and configured as IMC tiles, each coupled to a respective N-bit adder 1280. The memory arrays 1210 each comprise a set 642 (referred to in FIG. 12 as a core) of rows (see 644 in FIG. 6) of bit cells, which may typically be implemented using 6 or 8 transistor bit cells, and a set 646 of one or more rows (see 648 in FIG. 6) of IMC cells (which may typically be implemented using pairs of 8, 10, or 12 transistor bit cells). As illustrated, an n×Log$_2$N adder 1290 provides a final accumulation value, and optionally may compensate for system bias. The embodiment of FIG. 12 may be particular useful when masking is employed to provide sparsity in the accumulation of output XOR results.

Figure 13A:
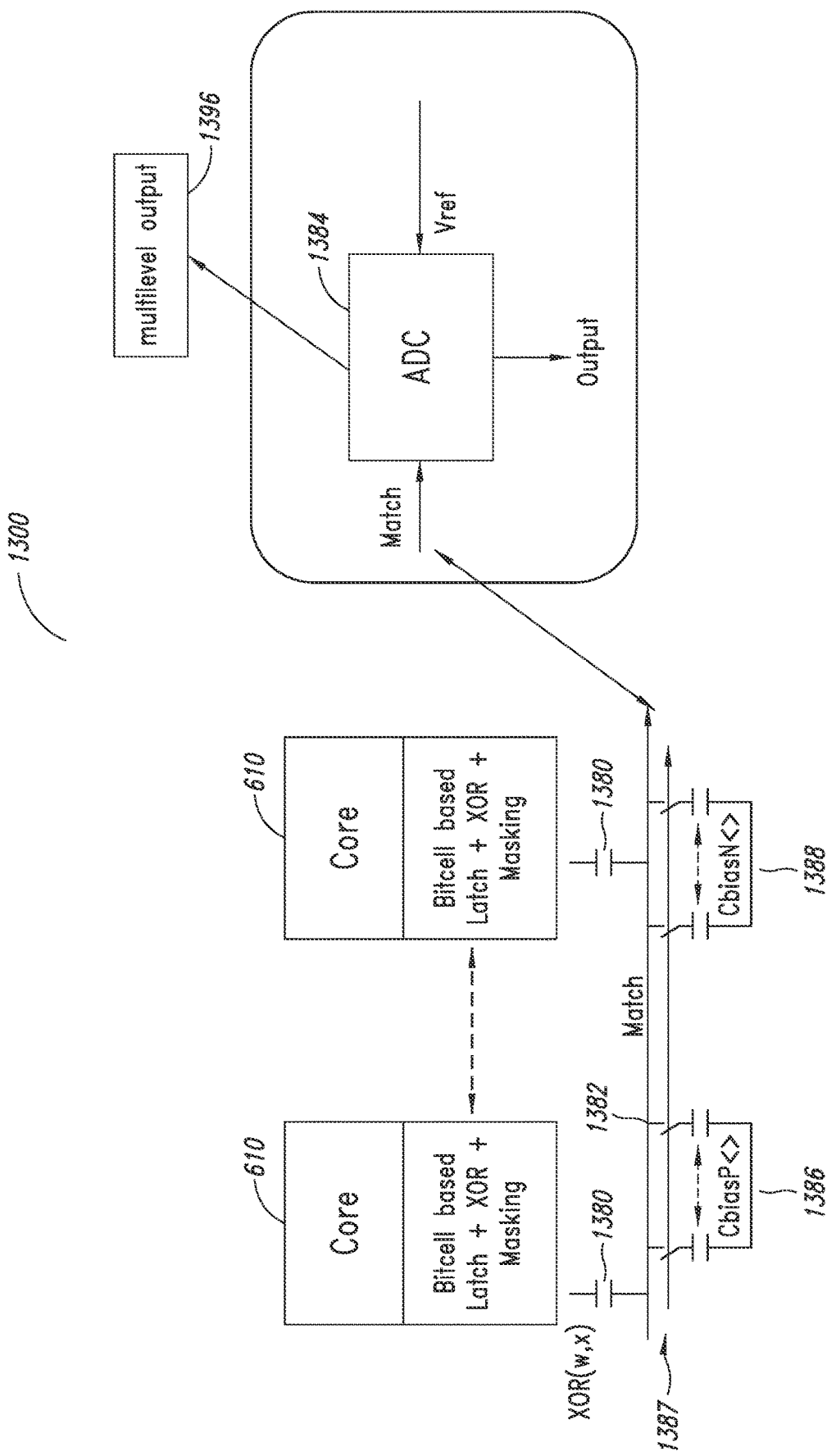
FIGS. 13A and 13B illustrate additional embodiments of systems employing a plurality of IMC tiles to implement multiply-accumulate operations.

FIG. 13A illustrates an embodiment of a system 1300 employing a plurality of n memory arrays configured as IMC tiles to implement multiply-accumulate operations using capacitive-based accumulation. For convenience, FIG. 13A will be described with reference to FIGS. 1 and 6. The system 1300 comprises a plurality of IMC memory arrays 610, each coupled to a respective capacitive element 1380 to accumulate the results of XOR calculations performed by the IMC memory array 610. The capacitive elements 1380 are coupled to a Match line 1382, generating a match signal Match, which may be provided as an input to an analog to digital converter ADC 1384. The match line 1382 also is selectively coupled to bias capacitive elements CbiasP 1386 and CbiasN 1388 through switches 1387. The switches may be controlled by the system 100 to provide a programmed bias. Capacitive bias elements CbiasP may store positive bias charges, for example, based on a PCHOFF signal or a delayed PCHOFF signal, and capacitive bias element CbiasN may store a negative bias charge, for example, based on the inverse of the PCHOFF signal or a delayed version of the inverse of the PCHOFF signal. Applying a programmable bias to an accumulated value facilitates batch normalization in neural network applications.

The capacitive elements 1380, 1386, 1388, may include device-based capacitances (e.g., Nmos, Pmos), metal capacitors, trench capacitors, etc., or various combinations thereof.

The ADC 1384 also receives a reference voltage Vref, which may correspond, for example, to an n/2 Match line 1392 bump equivalent. The output of the ADC 1384 indicates a count of XOR accumulations. The output may be provided to a multilevel analog-to-digital converter 1396 to provide a multibit classification output.

Figure 13B:
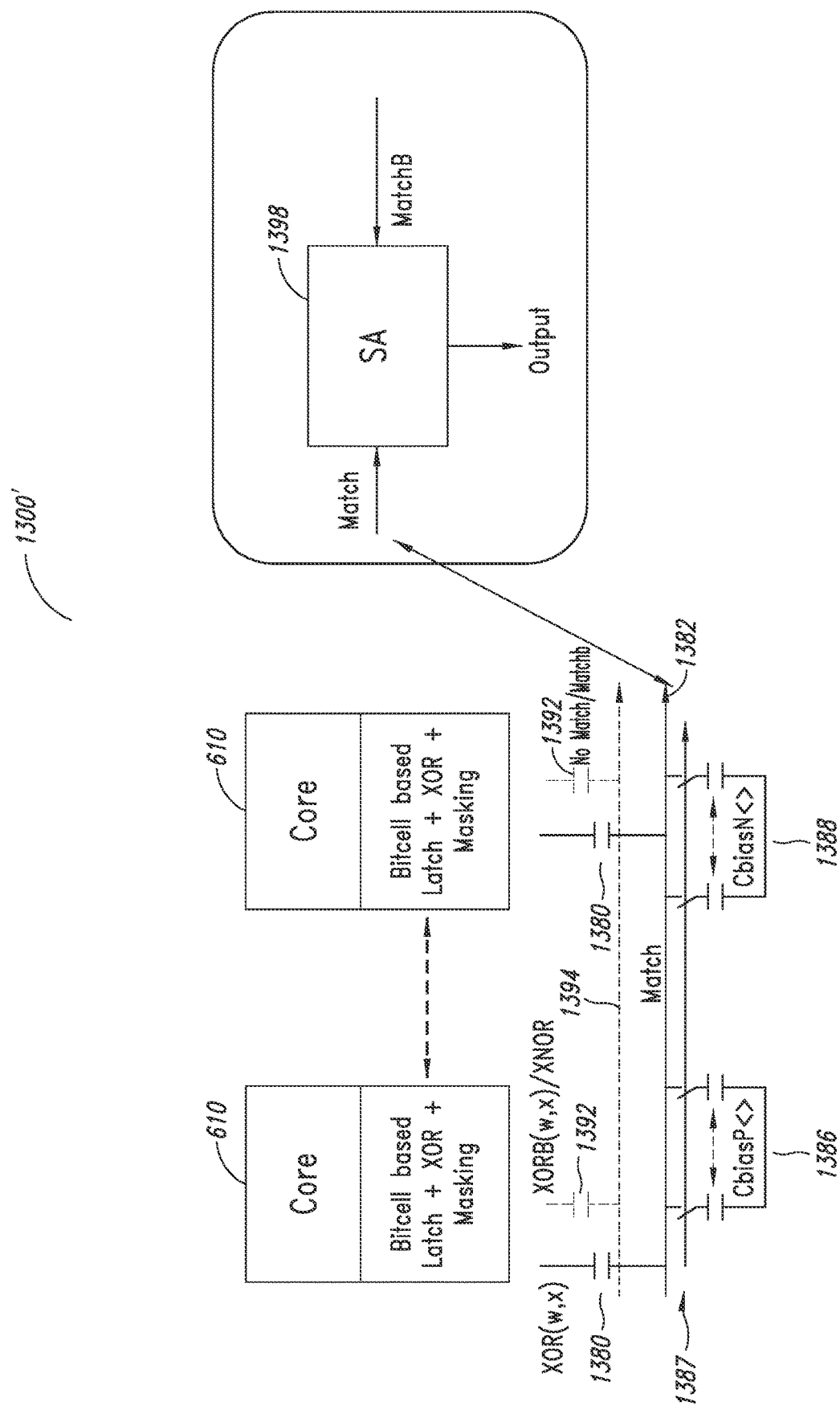

FIG. 13B illustrates another embodiment of a system 1300', employing a plurality of n memory arrays configured as IMC tiles to implement multiply-accumulate operations using capacitive-based accumulation. The system 1300' of FIG. 13B differs from the system 1300 of FIG. 13A in that each of the plurality of IMC memory arrays 610 also generates complementary XORB results, which are provided to a respective capacitive elements 1392 to accumulate the results of XORB calculations performed by the IMC memory array 610, generating a no match signal, Matchb on a No Match line 1394. The Matchb signal on line 1394 is provided to successive approximation (SA) circuit 1398 in addition to Match signal on line 1382. The output of the SA circuit 1398 indicates whether the accumulated matches exceed the accumulated no matches, and may serve as a classification signal. Capacitive bias elements also may be coupled to the No Match line 1394 in a manner similar to that discussed above with respect to FIG. 13A.

Figure 14:
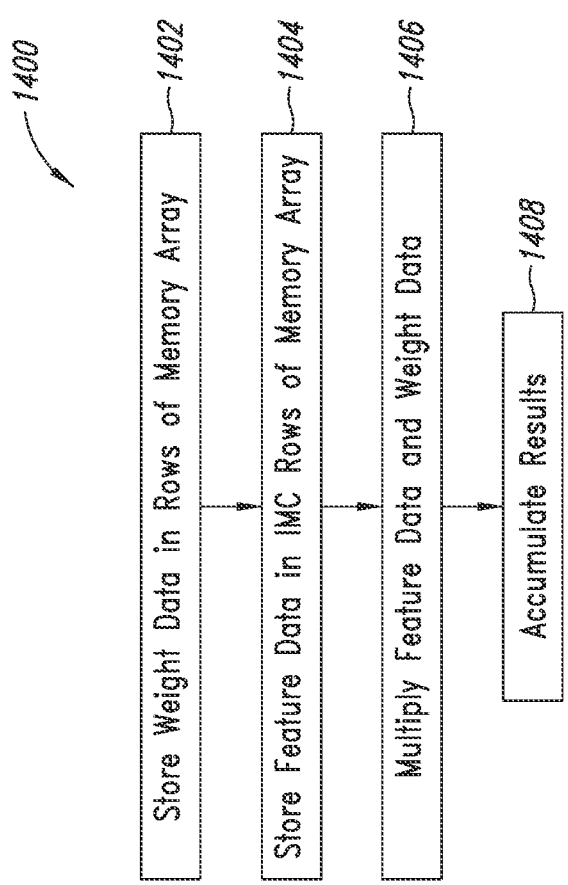
FIG. 14 illustrates an embodiment of a method of performing IMC operations using an IMC memory array.

FIG. 14 illustrates an embodiment of a method 1400 of performing IMC operations using an IMC memory array, and will be described for convenience with reference to FIGS. 1, 6, 12 and 13. The method may be performed, for example, under control of the memory management circuitry 160 of claim 1, and using the IMC memory array 610 of FIG. 6.

At 1402, the method 1400 stores weight data in a plurality of rows of an in-memory-compute (IMC) memory array. For example, weight data may be stored in one or more rows 644 of the set 642 of rows of bit-cells, or may be stored in one or more rows 648 of the set of rows 646 of IMC cells, when such rows of IMC cells are configured to operate in a bit-cell mode of operation, or various combinations thereof. The method proceeds from 1402 to 1404.

At 1404, the method 1400 stores feature data in one or more rows of an IMC memory array. For example, feature data may be stored in one or more rows 648 of the set of rows 646 of IMC cells which are configured to operate in an IMC mode of operation. The method 1400 proceeds from 1404 to 1406.

At 1406, the method 1400 multiplies feature data stored in IMC cells of one or more columns of the IMC memory array and weight data stored in the respective columns. For example, an IMC cell 402 of a column 630 may XOR feature data stored in the latches of an IMC cell 402 of the column and weight data stored in other cells of the column 630. The multiplying may be repeated for addition columns of the IMC array 610, or for different IMC cells of the column 630. The method 1400 proceeds from 1406 to 1408.

At 1408, the method 1400 accumulates results of the multiplications. For example, an adder 1280 or capacitors 1380 may be employed to accumulate the results.

Embodiments of the method 1400 of FIG. 14 may not include all of the illustrated acts, may include additional acts, may combine acts, and may perform acts in various orders. For example, the accumulation at 1408 may be omitted in some embodiments; the storing of weight data at 1402 may occur after or in parallel with the storing of feature data at 1404 in some embodiments; loops may employed (e.g., loading a set of weight data, followed by loops of loading feature data and accumulating results); an act of compensating for bias may be performed; an addition act of generating a classification signal may be performed; etc.; and various combinations thereof.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An in-memory-compute memory cell, comprising:
 a first bit-cell having a latch, a write-bit line and a complementary write-bit line; and
 a second bit-cell having a latch, a write-bit line and a complementary write-bit line, wherein the write-bit line of the first bit-cell is coupled to the complementary write-bit line of the second bit-cell and the complementary write-bit line of the first bit-cell is coupled to the write-bit line of the second bit-cell, wherein the first bit-cell comprises a read-word line, and the second bit-cell comprises a read-word line, and, in an in-memory-compute mode of operation, the in-memory-compute cell XORs data stored in the latches with data provided on the read-word lines.

2. The in-memory-compute cell of claim 1, wherein the first bit-cell and the second bit-cell are foundry bit-cells.

3. The in-memory-compute cell of claim 2, wherein the first bit-cell and second bit-cell are eight transistor bit-cells.

4. The in-memory-compute cell of claim 1, wherein the first bit-cell comprises a read-bit line, and the second bit-cell comprises a read-bit line, and, in the in-memory-compute mode of operation, the in-memory-compute cell XORs feature data stored in the latches with weight data provided on the read-word lines.

5. A memory array, comprising:
 a plurality of bit-cells of the memory array arranged as a set of rows of bit-cells of the memory array intersecting a plurality of columns of the memory array; and
 a plurality of in-memory-compute (IMC) cells of the memory array arranged as a set of rows of IMC cells of the memory array intersecting the plurality of columns of the memory array, wherein each of the IMC cells of the memory array includes:
 a first bit-cell having a latch, a write-bit line and a complementary write-bit line; and a second bit-cell having a latch, a write-bit line and a complementary write-bit line, wherein the write-bit line of the first bit-cell is coupled to the complementary write-bit line of the second bit-cell and the complementary write-bit line of the first bit-cell is coupled to the write-bit line of the second bit-cell, wherein, the first bit-cells of the IMC cells comprise a read-word line, and the second bit-cells of the IMC cells comprise a read-word line, and, in an in-memory-compute mode of operation of the array, the IMC cells selectively XOR data stored in the latches with data provided on the read-word lines.

6. The memory array of claim 5, wherein the plurality of bit-cells, the first bit-cells of the IMC cells, and the second bit-cells of the IMC cells are foundry bit-cells.

7. The memory array of claim 6, wherein,
the plurality of bit-cells are six transistor bit-cells; and
the first bit-cells of the IMC cells and the second bit-cells of the IMC cells are eight transistor bit-cells.

8. The memory array of claim 5, wherein the first bit-cells of the IMC cells comprise a read-bit line, and the second bit-cells of the IMC cells comprise a read-bit line, and, in the in-memory-compute mode of operation of the array, the IMC cells selectively XOR feature data stored in the latches with weight data provided on the read-word lines.

9. The memory array of claim 5, wherein the array comprises pre-charging circuitry coupled to the plurality of IMC cells.

10. The memory array of claim 9 wherein the pre-charging circuitry comprises masking circuitry, which, in operation, selectively masks outputs of columns of the array.

11. The memory array of claim 5 wherein the set of rows of bit-cells comprises a plurality of rows of bit cells and the set of rows of IMC cells comprises a plurality of rows of IMC cells.

12. The memory array of claim 11, comprising selection circuitry coupled to the set of rows of IMC cells, wherein the selection circuitry, in operation, selects a row of the plurality of rows of IMC cells.

13. The memory array of claim 11, wherein the set of rows of IMC cells comprises four rows of IMC cells.

14. The memory array of claim 12, wherein, in operation, individual rows of the set of rows of IMC cells are configurable to operate in an IMC mode of operation or in a bit-cell mode of operation.

15. A system, comprising:
a plurality of in-memory-compute (IMC) memory arrays, each IMC memory array including:
a plurality of bit-cells arranged as a set of rows of bit-cells intersecting a plurality of columns of the IMC memory array; and
a plurality of in-memory-compute (IMC) cells of the IMC memory array arranged as a set of rows of IMC cells intersecting the plurality of columns of the IMC memory array, each of the IMC cells of the IMC memory array having:
a first bit-cell having a latch, a write-bit line and a complementary write-bit line; and
a second bit-cell having a latch, a write-bit line and a complementary write-bit line, wherein the write-bit line of the first bit-cell is coupled to the complementary write-bit line of the second bit-cell and the complementary write-bit line of the first bit-cell is coupled to the write-bit line of the second bit-cell; and
accumulation circuitry coupled to the columns of the plurality of IMC memory arrays, wherein the first bit-cells of the IMC cells comprise a read-word line, and the second bit-cells of the IMC cells comprise a read-word line, and, in an in-memory-compute mode of operation of the system, the IMC cells selectively XOR data stored in the latches with data provided on the read-word lines.

16. The system of claim 15, wherein the plurality of bit-cells of the plurality of IMC memory arrays, the first bit-cells of the IMC cells, and the second bit-cells of the IMC cells are foundry bit-cells.

17. The system of claim 15, wherein the first bit-cells of the IMC cells comprise a read-bit line, and the second bit-cells of the IMC cells comprise a read-bit line, and, in the in-memory-compute mode of operation of the system, the IMC cells selectively XOR feature data stored in the latches with weight data provided on the read-word lines.

18. A system, comprising:
a plurality of in-memory-compute (IMC) memory arrays, each IMC memory array including:
a plurality of bit-cells arranged as a set of rows of bit-cells intersecting a plurality of columns of the IMC memory array; and
a plurality of in-memory-compute (IMC) cells of the IMC memory array arranged as a set of rows of IMC cells intersecting the plurality of columns of the IMC memory array, each of the IMC cells of the IMC memory array having:
a first bit-cell having a latch, a write-bit line and a complementary write-bit line; and
a second bit-cell having a latch, a write-bit line and a complementary write-bit line, wherein the write-bit line of the first bit-cell is coupled to the complementary write-bit line of the second bit-cell and the complementary write-bit line of the first bit-cell is coupled to the write-bit line of the second bit-cell; and
accumulation circuitry coupled to the columns of the plurality of IMC memory arrays, wherein the plurality of IMC memory arrays comprise pre-charging circuitry coupled to the plurality of IMC cells.

19. The system of claim 18 wherein the pre-charging circuitry comprises masking circuitry, which, in operation, selectively masks outputs of columns of the array.

20. The system of claim 15, wherein the accumulation circuitry comprises a plurality of adders.

21. The system of claim 15, wherein the accumulation circuitry comprises one or more capacitors.

22. The system of claim 21, comprising one or more bias capacitors selectively coupleable to the accumulation circuitry.

23. The system of claim 21, comprising readout circuitry coupled to the one or more capacitors.

24. The system of claim 23, wherein the readout circuitry comprises an analog-to-digital converter.

25. The system of claim 23, wherein the readout circuitry comprises a successive approximation circuit.

26. A method, comprising:
storing weight data in a plurality of rows of an in-memory-compute (IMC) memory array arranged as a plurality of rows of cells intersecting a plurality of columns of cells, the IMC memory array include a set of rows of bit-cells and a set of rows of IMC cells, wherein each of the IMC cells of the IMC memory array includes:
a first bit-cell having a latch, a write-bit line and a complementary write-bit line; and a second bit-cell having a latch, a write-bit line and a complementary write-bit line, wherein the write-bit line of the first bit-cell is coupled to the complementary write-bit line of the second bit-cell and the complementary write-bit line of the first bit-cell is coupled to the write-bit line of the second bit-cell;

storing feature data in one or more rows of the set of rows of IMC cells; and multiplying, using an IMC cell of a column of the IMC memory array, feature data stored in the IMC cell and weight data stored in the column of the IMC cell, wherein the first bit-cell of the IMC cell comprises a read-word line, and the second bit-cell of the IMC cell comprises a read-word line, and, the multiplying includes XORing data stored in the latches of the IMC cell with data provided on the read-word lines of the IMC cell.

27. The method of claim 26, comprising controlling an operation mode of individual rows of the set of rows of IMC cells.

28. The method of claim 26, wherein the multiplying is performed for a set of the plurality of columns and the method comprises accumulating multiplication results for the set of columns.

29. The method of claim 28, comprising accumulating multiplication results of a plurality of IMC memory arrays.

30. The method of claim 29, comprising applying a bias to the accumulated multiplication results.

31. The method of claim 29, comprising generating a classification signal of a neural network based on the accumulated multiplication results of the plurality of IMC memory arrays.

32. A non-transitory computer-readable medium having contents, which, in operation, configure a computing system to perform a method, the method comprising:
    storing weight data in a plurality of rows of an in-memory-compute (IMC) memory array arranged as a plurality of rows of cells intersecting a plurality of columns of cells, the IMC memory array include a set of rows of bit-cells and a set of rows of IMC cells, wherein each of the IMC cells of the IMC memory array includes:
        a first bit-cell having a latch, a write-bit line and a complementary write-bit line; and
        a second bit-cell having a latch, a write-bit line and a complementary write-bit line, wherein the write-bit line of the first bit-cell is coupled to the complementary write-bit line of the second bit-cell and the complementary write-bit line of the first bit-cell is coupled to the write-bit line of the second bit-cell;
    storing feature data in one or more rows of the set of rows of IMC cells; and
    multiplying, using an IMC cell of a column of the IMC memory array, feature data stored in the IMC cell and weight data stored in the column of the IMC cell, wherein the first bit-cell of the IMC cell comprises a read-word line, and the second bit-cell of the IMC cell comprises a read-word line, and, the multiplying includes XORing data stored in the latches of the IMC cell with data provided on the read-word lines of the IMC cell.

33. The non-transitory computer-readable medium of claim 32 wherein the contents comprise instructions executed by the computing system.

* * * * *